(12) United States Patent
Shiozaki et al.

(10) Patent No.: US 10,985,471 B2
(45) Date of Patent: Apr. 20, 2021

(54) RADAR DEVICE

(71) Applicant: Panasonic Intellectual Property Management Co., Ltd., Osaka (JP)

(72) Inventors: Ryosuke Shiozaki, Tokyo (JP); Tomohiro Yui, Kanagawa (JP); Ken Takahashi, Ishikawa (JP); Yuichi Kashino, Ishikawa (JP); Kouji Suzuki, Kanagawa (JP); Noriaki Saito, Tokyo (JP); Shigeki Nakamura, Osaka (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 185 days.

(21) Appl. No.: 16/198,913

(22) Filed: Nov. 23, 2018

(65) Prior Publication Data
US 2019/0165484 A1    May 30, 2019

(30) Foreign Application Priority Data

Nov. 27, 2017 (JP) .............................. JP2017-226983
Oct. 11, 2018 (JP) .............................. JP2018-192852

(51) Int. Cl.
*H01Q 19/06* (2006.01)
*G01S 13/931* (2020.01)
(Continued)

(52) U.S. Cl.
CPC .............. *H01Q 19/06* (2013.01); *G01S 7/03* (2013.01); *G01S 7/032* (2013.01); *G01S 13/931* (2013.01);
(Continued)

(58) Field of Classification Search
CPC .......... G01S 7/03; G01S 7/032; G01S 13/931; H01Q 1/3233; H01Q 1/325; H01Q 1/3283;
(Continued)

(56) References Cited

U.S. PATENT DOCUMENTS 6,496,138 B1     12/2002   Honma
2005/0073433 A1*  4/2005   Gunderson ............ B60Q 9/006
                                                    340/903
(Continued)

FOREIGN PATENT DOCUMENTS

CN      1251657 A    4/2000
CN    104144589 A   11/2014
(Continued)

OTHER PUBLICATIONS

The Extended European Search Report dated Apr. 8, 2019 for the related European Patent Application No. 18207923.6.
(Continued)

*Primary Examiner* — Dao L Phan
(74) *Attorney, Agent, or Firm* — Seed IP Law Group LLP

(57) ABSTRACT

A radar device includes: a housing that includes an aperture in a front direction as a transmitting direction of an electromagnetic wave; a circuit board disposed in the housing such that a board surface extends along the front direction; an antenna unit that includes antenna elements being arrayed along a direction intersecting the front direction in a region on a side in the front direction of the circuit board, and that transmits the electromagnetic wave to the outside of the housing through the aperture and receives a reflected wave of the electromagnetic wave; and a dielectric lens that is disposed in the aperture of the housing to extend along a direction in which the antenna elements are arrayed and that has a semi-cylindrical shape or a parabolic-cylindrical shape projecting in the front direction.

16 Claims, 10 Drawing Sheets

(51) Int. Cl.

| | | |
|---|---|---|
| G01S 7/03 | (2006.01) | |
| H01Q 1/32 | (2006.01) | |
| H01Q 21/08 | (2006.01) | |
| H01Q 15/08 | (2006.01) | |
| H01Q 19/30 | (2006.01) | |
| H01Q 1/42 | (2006.01) | |
| H01Q 3/34 | (2006.01) | |
| H01Q 9/04 | (2006.01) | |
| H01Q 19/10 | (2006.01) | |
| H05K 1/02 | (2006.01) | |
| H05K 1/18 | (2006.01) | |
| H05K 7/14 | (2006.01) | |
| G01S 13/87 | (2006.01) | |
| G01S 7/02 | (2006.01) | |

(52) U.S. Cl.
CPC .......... *H01Q 1/325* (2013.01); *H01Q 1/3233* (2013.01); *H01Q 1/3283* (2013.01); *H01Q 1/42* (2013.01); *H01Q 3/34* (2013.01); *H01Q 9/0407* (2013.01); *H01Q 15/08* (2013.01); *H01Q 19/062* (2013.01); *H01Q 19/10* (2013.01); *H01Q 19/30* (2013.01); *H01Q 21/08* (2013.01); *H05K 1/0243* (2013.01); *H05K 1/181* (2013.01); *H05K 7/1427* (2013.01); *G01S 13/87* (2013.01); *G01S 2007/028* (2013.01); *G01S 2013/9327* (2020.01); *G01S 2013/93271* (2020.01); *G01S 2013/93273* (2020.01); *G01S 2013/93274* (2020.01); *G01S 2013/93275* (2020.01); *H01Q 1/3275* (2013.01); *H05K 2201/10098* (2013.01); *H05K 2201/10545* (2013.01)

(58) Field of Classification Search
CPC .......... H01Q 1/42; H01Q 3/34; H01Q 9/0407; H01Q 15/08; H01Q 19/062; H01Q 19/10; H01Q 19/30; H01Q 21/08; H01Q 19/06; H05K 1/0243; H05K 1/181; H05K 7/1427

See application file for complete search history.

(56) References Cited

U.S. PATENT DOCUMENTS

| | | |
|---|---|---|
| 2005/0219126 A1 | 10/2005 | Rebeiz et al. |
| 2008/0048921 A1 | 2/2008 | Rebeiz et al. |
| 2009/0140911 A1 | 6/2009 | Kato et al. |
| 2013/0229299 A1 | 9/2013 | Matsuzawa et al. |
| 2014/0070982 A1 | 3/2014 | Inada et al. |
| 2014/0225129 A1 | 8/2014 | Inoue et al. |
| 2015/0207236 A1 | 7/2015 | Felic et al. |
| 2020/0091608 A1* | 3/2020 | Alpman ................ H01Q 1/38 |

FOREIGN PATENT DOCUMENTS

| | | | |
|---|---|---|---|
| CN | 105846043 A | 8/2016 | |
| CN | 106450782 A | 2/2017 | |
| EP | 1462817 A1 | 9/2004 | |
| EP | 1677126 A1 | 7/2006 | |
| EP | 2 802 006 A2 | 11/2014 | |
| JP | 2008-503904 | 2/2008 | |
| JP | 2009-103457 A | 5/2009 | |
| WO | WO-9629755 A1 * | 9/1996 | ............ B60R 11/02 |
| WO | 2005/094352 | 10/2005 | |
| WO | 2014/090565 A1 | 6/2014 | |

OTHER PUBLICATIONS

The Extended European Search Report dated Apr. 8, 2019 for the related European Patent Application No. 18207924.4.
European Office Action dated Apr. 7, 2020 for the related European Patent Application No. 18207924.4, 7 pages.
European Office Action dated Apr. 16, 2020 for the related European Patent Application No. 18207923.6, 7 pages.
Communication pursuant to Article 94(3) EPC dated Jan. 13, 2021 for the related European Patent Application No. 18207924.4, 5 pages.
Communication pursuant to Article 94(3) EPC dated Jan. 14, 2021 for the related European Patent Application No. 18207923.6, 5 pages.
Chinese Office Action dated Jan. 18, 2021 for the related Chinese Patent Application No. 201811405286.6, 20 pages. (With English Translation).

* cited by examiner

FIG. 1
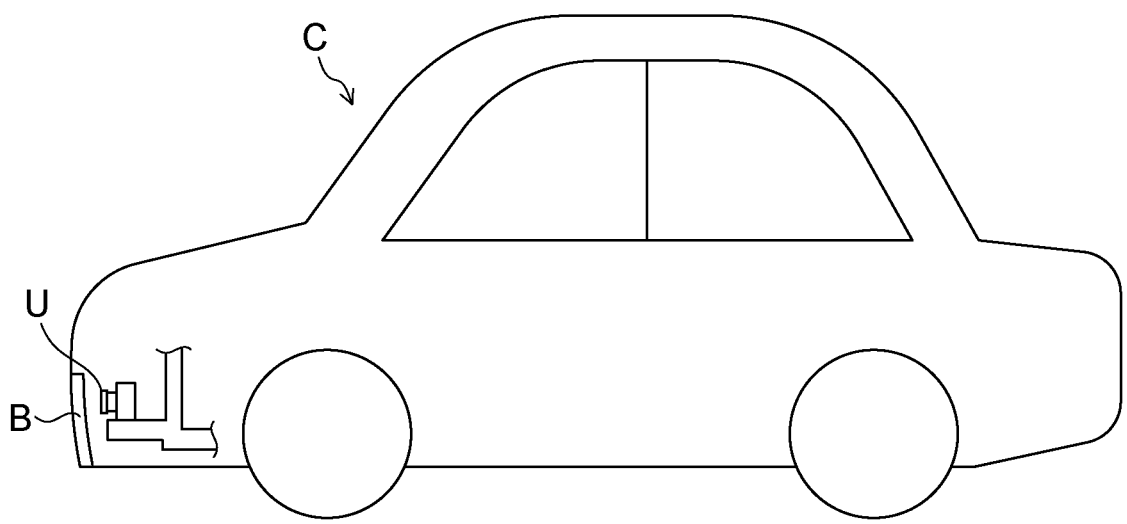
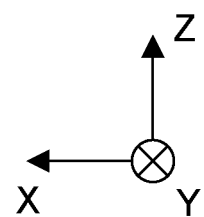

RADAR DEVICE

BACKGROUND

1. Technical Field

The present disclosure relates to a radar device.

2. Description of the Related Art

A radar device has been known, which uses electromagnetic waves in a frequency band of millimeter-waves and microwaves to detect a position of an object (hereinafter also referred to as "target") without contact. Such radar device is, for example, mounted in a vehicle and used for monitoring multiple directions including a front direction, front-side directions, and rear-side directions.

SUMMARY

As such a radar device, a radar device mounted in a lateral direction, in which a circuit board on which an antenna unit is mounted is arranged parallel to a direction of transmitting electromagnetic waves, has been recently under consideration from the viewpoints of, for example, reducing a space for mounting the radar device and enhancing a degree of freedom in selecting a position for mounting the radar device.

For example, Japanese Unexamined Patent Application Publication (Translation of PCT Application) No. 2008-503904 (PTL 1) discusses a radar device mounted in a lateral direction and achieving wide-area detection of an object by radially disposing on a board multiple end-fire antennas facing in directions different from each other.

However, the radar device discussed in PTL 1 has a problem in that the azimuth resolution capability for detecting the object is insufficient because the directions of transmitting the electromagnetic waves are limited to the directions that the respective end-fire antennas face. The radar device disclosed in PTL 1 has also a problem in that it is difficult to achieve the antenna gain.

One non-limiting and exemplary embodiment provides a radar device that has a device configuration of being mounted in a lateral direction and achieves high antenna gain and high azimuth resolution capability.

In one general aspect, the techniques disclosed here feature a radar device, including: a housing that includes an aperture in a front direction as a transmitting direction of an electromagnetic wave; a circuit board that is disposed in the housing such that a board surface extends along the front direction; an antenna unit that includes multiple antenna elements being arrayed along a direction intersecting the front direction in a region on a side in the front direction of the circuit board, and that transmits the electromagnetic wave to outside of the housing through the aperture and receives a reflected wave of the electromagnetic wave; and a dielectric lens that is disposed in the aperture of the housing to extend along a direction in which the multiple antenna elements are arrayed, and that has a semi-cylindrical shape or a parabolic-cylindrical shape projecting in the front direction.

The radar device according to the present disclosure may have a device configuration of being mounted in a lateral direction and achieve high antenna gain and high azimuth resolution capability.

Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

BRIEF DESCRIPTION OF THE DRAWINGS

FIG. 1 is a diagram illustrating an example of a radar device according to a first embodiment being disposed in a vehicle;

DETAILED DESCRIPTION

Embodiments of the present disclosure are described below with reference to accompanied drawings. In this description and the drawings, descriptions of constituents having substantially the same functions are not repeated by using the same reference signs.

In order to clarify positional relationships between the constituents, a common orthogonal coordinate system (X, Y, Z) based on a front direction in which a radar device transmits electromagnetic waves to the outside of the device (i.e., a direction as a target of object detection) is indicated throughout the drawings. Hereinafter, descriptions are given using an X-axis positive direction representing the front direction in which the radar device transmits the electromagnetic waves to the outside of the device (hereinafter abbreviated as "front direction"), a Y-axis positive direction representing a right side surface direction of the radar device, and a Z-axis positive direction representing an upward direction of the radar device (hereinafter abbreviated as "upward direction").

First Embodiment

An example of a configuration of a radar device according to this embodiment is described with reference to FIGS. 1 to 4. Hereinafter, a vehicle-mounted radar device is described as an example of a preferable usage of the radar device of the present disclosure.

FIG. 1 is a diagram illustrating an example in which a radar device U according to this embodiment is disposed in a vehicle.

For example, the radar device U according to this embodiment is disposed in a cover member B (here, a bumper member B) of a vehicle C and performs transmission and reception of electromagnetic waves through the cover member B.

Figure 2:
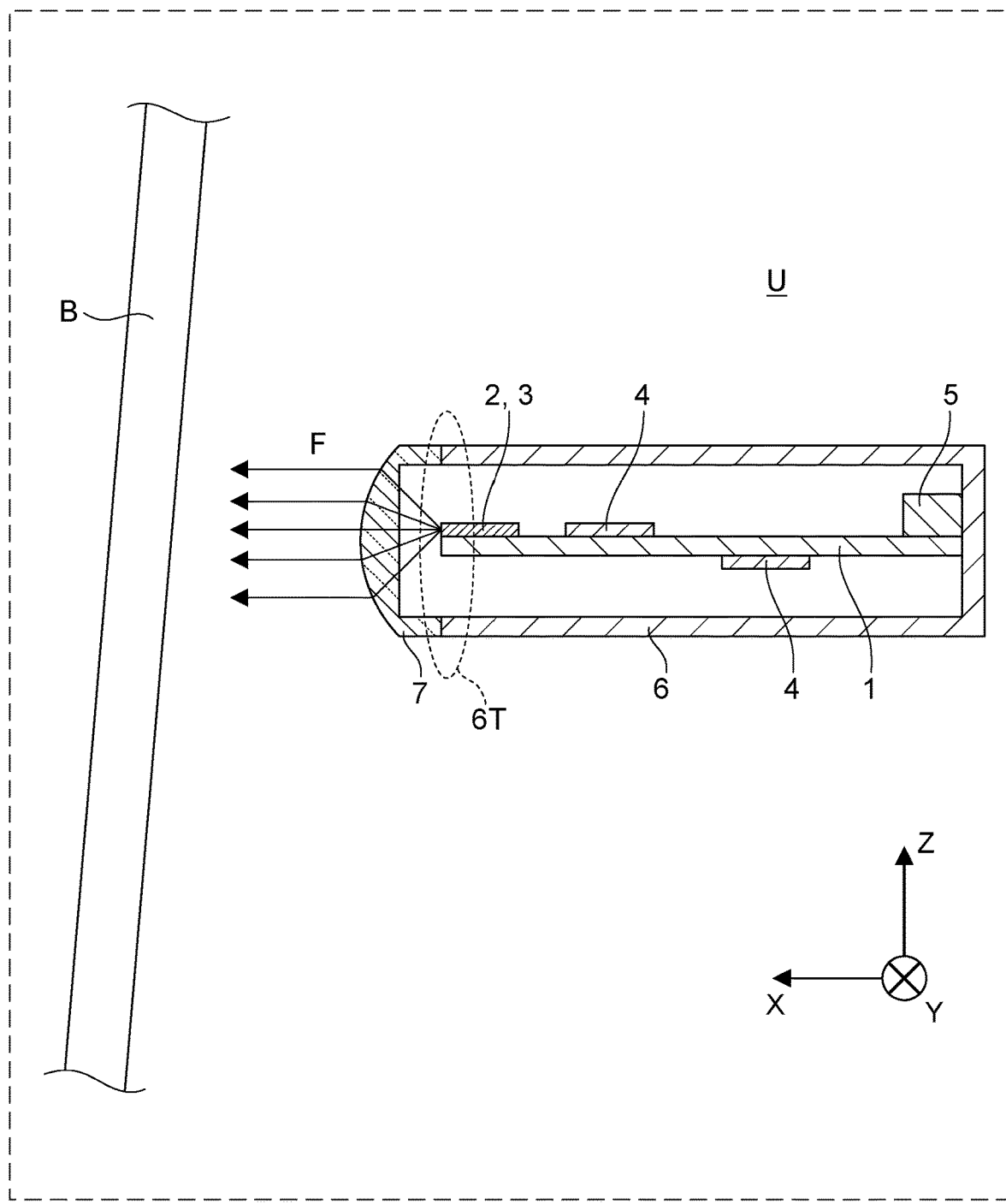
FIG. 2 is a side sectional view illustrating an example of a configuration of the radar device according to the first embodiment.
Figure 3:
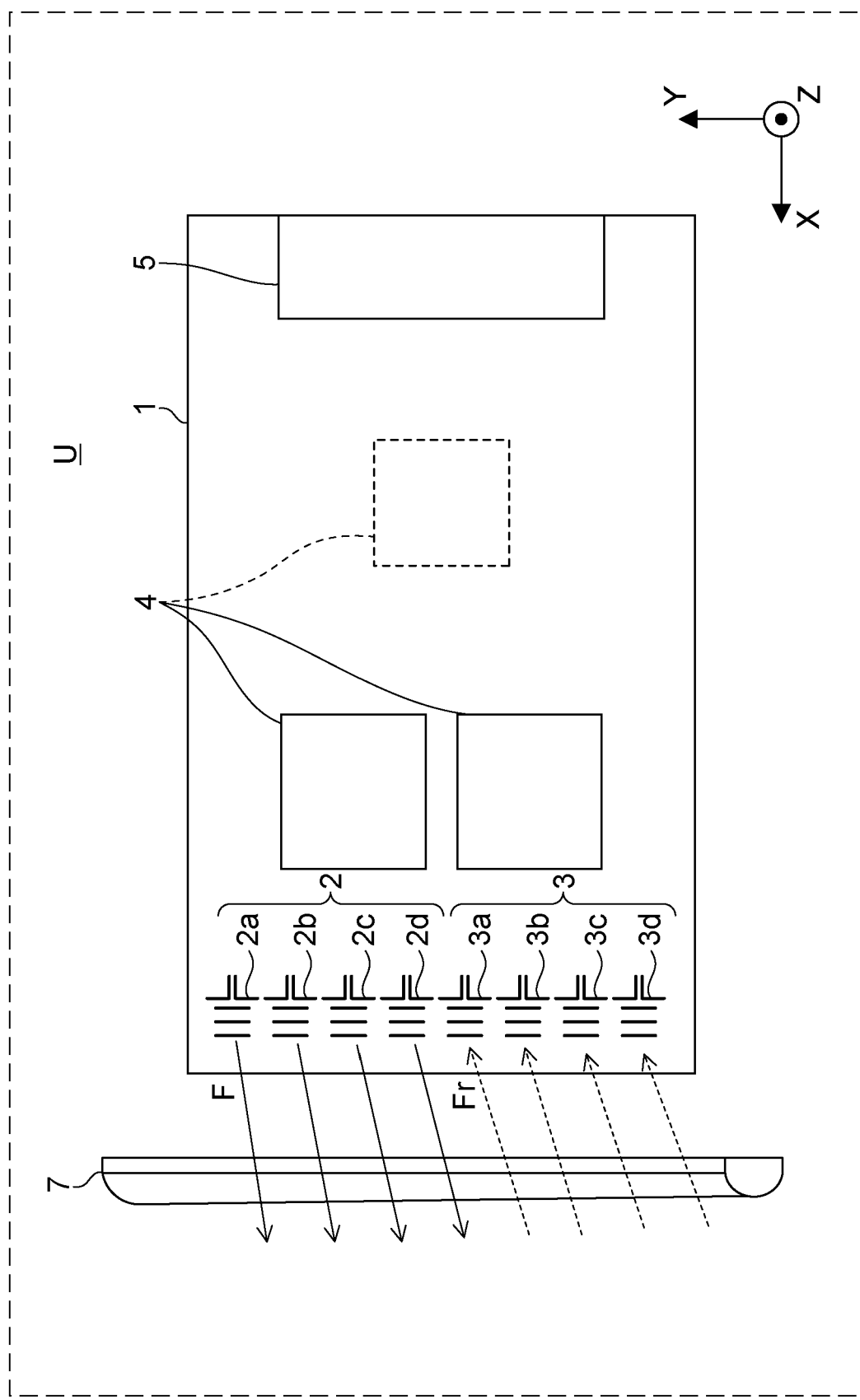
FIG. 3 is a view of the radar device according to the first embodiment seen from above.

FIG. 2 is a side sectional view illustrating an example of a configuration of the radar device U according to this embodiment. FIG. 3 is a view of the radar device U according to this embodiment seen from above.

Solid arrows F in FIGS. 2 and 3 represent the electromagnetic waves transmitted by a transmitting antenna. Dotted line arrows Fr represent the reflected waves from the target. In FIGS. 2 and 3, illustration of a structure supporting the radar device U in the vehicle C is omitted. In FIG. 3, illustration of a housing 6 is omitted.

The radar device U according to this embodiment includes a circuit board 1, a transmitting antenna 2, a receiving antenna 3, signal processing ICs 4, a connector 5, the housing 6, and a dielectric lens 7.

The circuit board 1 is a board on which the transmitting antenna 2, the receiving antenna 3, the signal processing ICs 4, the connector 5, and so on are mounted. The transmitting antenna 2, the receiving antenna 3, the signal processing ICs 4, the connector 5, and so on are mounted on a board surface of a front surface side or back surface side of the circuit board 1 while wiring (not illustrated) for electrically connecting these mounted parts (the transmitting antenna 2, the receiving antenna 3, the signal processing ICs 4, the connector 5, and so on) is patterned.

The circuit board 1 is disposed such that the extending direction of the board surface is parallel to the front-rear direction. In this case, the circuit board 1 is disposed such that the extending direction of the board surface intersects the extending direction of the cover member B.

Material of the circuit board 1 is not specifically limited in the present disclosure; however, it is possible to use a printed circuit board (PCB), for example. Also, a multilayer board or a semiconductor board in which the signal processing ICs 4 are mounted may also be used as the circuit board 1. The circuit board 1 typically has a flat plate shape.

The transmitting antenna 2 is disposed in a front region of the circuit board 1 and transmits the electromagnetic waves parallel to the board surface of the circuit board 1 toward a front end side of the circuit board 1. The receiving antenna 3 is disposed in the front region of the circuit board 1 and receives the reflected waves parallel to the board surface of the circuit board 1 from the direction of the front end side of the circuit board 1. In other words, the transmitting antenna 2 and the receiving antenna 3 have directivity characteristics of transmitting and receiving on the front end side of the circuit board 1.

The transmitting antenna 2 and the receiving antenna 3 respectively include multiple antenna elements being arrayed along the Y-axis direction in the front region on the board surface of the circuit board 1 (in FIGS. 3, 2a, 2b, 2c, and 2d represent the antenna elements of the transmitting antenna 2 while 3a, 3b, 3c, and 3d represent the antenna elements of the receiving antenna 3). That is, the transmitting antenna 2 and the receiving antenna 3 are each made as a phased array antenna, which changes the transmitting direction (and receiving direction) of the electromagnetic wave by electronic scanning. For example, FIG. 3 illustrates an aspect where the transmitting antenna 2 is disposed in a region on a positive Y direction side of the front region on the board surface of the circuit board 1 while the receiving antenna 3 is disposed in a region on a negative Y direction side of the front region on the board surface of the circuit board 1; however, the disposing aspect is determined as desired.

Typically, an end-fire array antenna having the directivity characteristics in the direction of the board end side of the circuit board 1 is applied as the antenna elements of the transmitting antenna 2 and the receiving antenna 3. The end-fire array antenna includes multiple strip conductors arranged such that their longitudinal directions are parallel to each other and transmits and receives the electromagnetic waves along the directions in which these multiple strip conductors are arranged.

The antenna elements of the transmitting antenna 2 and the receiving antenna 3 may be any antenna elements composed of a conductor pattern formed on the circuit board 1, and a Yagi array antenna, Fermi antenna, post-wall waveguide antenna, post-wall horn antenna, or the like can be applied instead of the end-fire array antenna.

Hereinafter, the transmitting antenna 2 and the receiving antenna 3 are also collectively called an "antenna unit." The transmitting antenna 2 and the receiving antenna 3 may be composed of an antenna shared for transmitting and receiving the electromagnetic waves.

The electromagnetic waves transmitted by the transmitting antenna 2 are converted to plane waves by the dielectric lens 7 and transmitted to the front side outside the radar device U (here, in substantially horizontal direction). The returning reflected waves that are part of the electromagnetic waves transmitted by the transmitting antenna 2 and reflected by the target outside device are collected by the dielectric lens 7 and transmitted to the receiving antenna 3. The transmitting antenna 2 and the receiving antenna 3 are respectively connected to the signal processing ICs 4 via wiring formed on the circuit board 1.

Each signal processing IC 4 (corresponding to a "signal processing unit" of the present disclosure) performs transmission and reception of an electric signal between the transmitting antenna 2 and the receiving antenna 3, allows the transmitting antenna 2 to transmit the electromagnetic waves, and receives and processes the reflected waves received by the receiving antenna unit 3.

For example, the signal processing IC 4 is composed mainly of a known microcomputer including a CPU, a ROM, a RAM, and so on, and also includes an oscillator and a signal processing circuit and the like for transmission and reception processing. Note that, part of the signal processing IC 4 may be implemented only with dedicated hardware without CPU or the like, and part of the processing of the signal processing IC 4 may be executed by external equipment such as a vehicle ECU.

In FIG. 3, as an example of the signal processing IC 4, a signal processing IC that performs signal processing relating to millimeter-wave bands for the transmitting antenna 2, a signal processing IC that performs signal processing relating to millimeter-wave bands for the receiving antenna 3, and a signal processing IC that performs signal processing relating to a baseband band are illustrated as individual chips.

Figure 4:
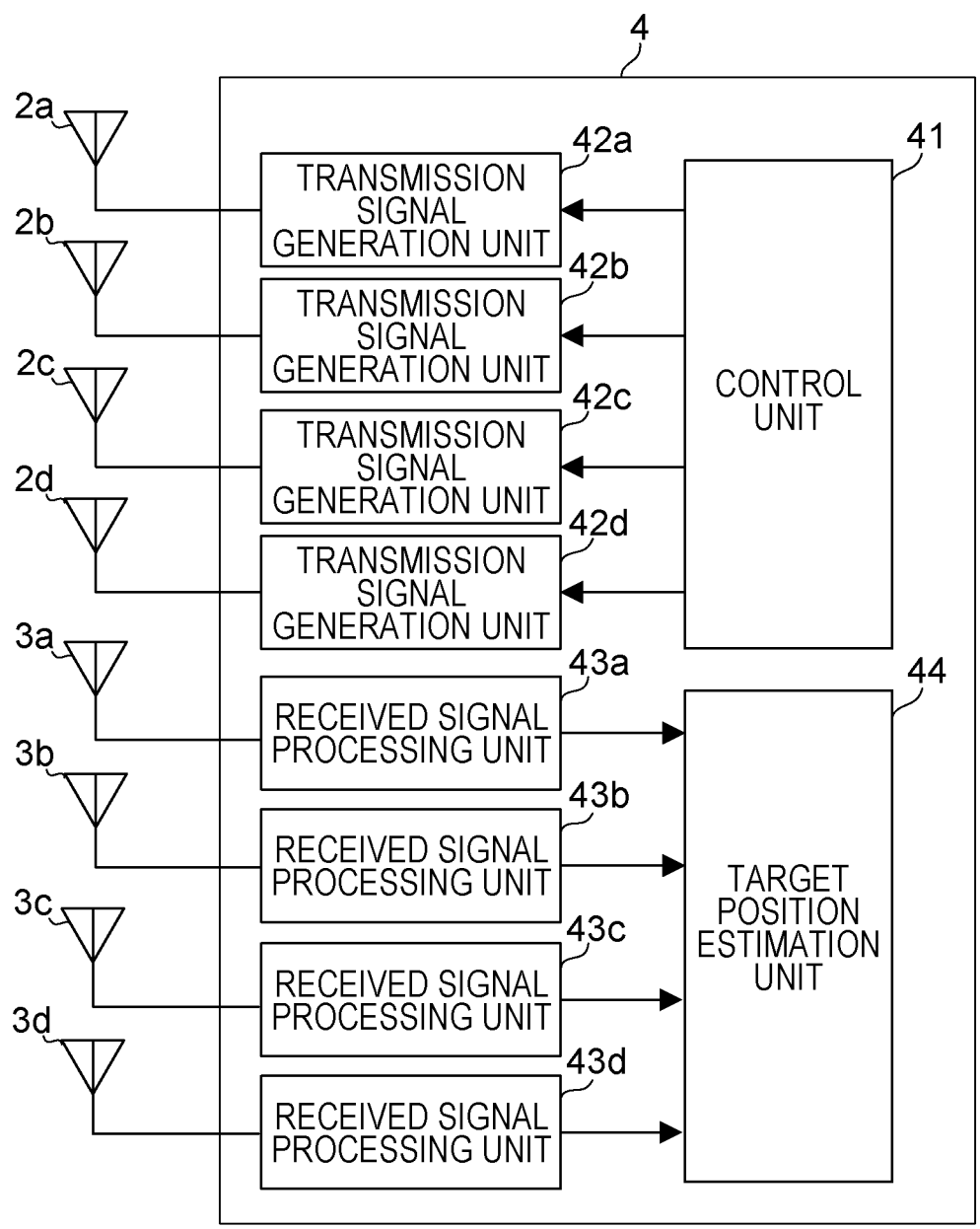
FIG. 4 is a block diagram illustrating a configuration of a signal processing IC of the radar device according to the first embodiment.

FIG. 4 is a block diagram illustrating a configuration of the signal processing IC 4 of the radar device U according to this embodiment.

For example, the signal processing IC 4 according to this embodiment includes the radar device U of the frequency modulated continuous wave (FM-CW) system. However, the radar device U may be of the pulse radar system.

For example, the signal processing IC 4 includes a control unit 41, transmission signal generation units 42*a* to 42*d* individually connected to the corresponding antenna elements 2*a* to 2*d* of the transmitting antenna 2, received signal processing units 43*a* to 43*d* individually connected to the corresponding antenna elements 3*a* to 3*d* of the receiving antenna 3, and a target position estimation unit 44 for obtaining received signals corresponding to the reflected waves from the target which are respectively received and processed by the received signal processing units 43*a* to 43*d*.

For example, the control unit 41 controls operations of the transmission signal generation units 42*a* to 42*d* and controls the direction of the electromagnetic waves transmitted from the radar device U to outside of the device by the electronic scanning. For example, the transmission signal generation units 42*a* to 42*d* use reference signals obtained from the oscillator to sequentially generate high-frequency (e.g., millimeter-wave frequency band) transmission signals, which is frequency-modulated such that the frequency temporally repeats gradual increase and gradual decrease. Based on the transmission signals, the transmission signal generation units 42*a* to 42*d* then transmit the transmission signals to the antenna elements 2*a* to 2*d* respectively connected to themselves and allow the antenna elements 2*a* to 2*d* respectively connected to themselves to transmit the frequency-modulated electromagnetic waves. The transmission signal generation units 42*a* to 42*d* change the direction of the electromagnetic waves transmitted from the radar device U to outside of the device (i.e., a combined wave of the electromagnetic waves transmitted from the antenna elements 2*a* to 2*d*) by respectively adjusting the phase of the electromagnetic waves transmitted from the antenna elements 2*a* to 2*d*.

For example, the received signal processing units 43*a* to 43*d* use local signals generated by the transmission signal generation units 42*a* to 42*d* to perform quadrature detection processing, frequency analysis processing, and the like on the received signals corresponding to the reflected waves obtained from the antenna elements 3*a* to 3*d* respectively connected to the received signal processing units 43*a* to 43*d* themselves.

The target position estimation unit 44 obtains the received signals corresponding to the reflected waves from the target which are respectively received and processed by the received signal processing units 43*a* to 43*d* and calculates phase differences of the reflected waves received by the antenna elements 3*a* to 3*d* to estimate the azimuth of the target. At that time, the target position estimation unit 44 may detect a distance to the target, a relative speed, and the like.

As described above, the estimation of the azimuth of the object detection by the electronic scanning makes it possible to further improve the resolution capability of the azimuth estimation comparing with the object detection using an antenna having a fixed directivity like the related-art technique in PTL 1.

Since the processing performed by the signal processing IC 4 is similar to that of a known configuration, detailed descriptions thereof are omitted.

The connector 5 communicably connects the signal processing ICs 4 and the external equipment (e.g., vehicle ECU mounted in vehicle C).

The housing 6 houses the circuit board 1 and supports the dielectric lens 7 in front of the circuit board 1. The housing 6 and the dielectric lens 7 are combined with each other, and the circuit board 1 is housed in the housing 6 and the dielectric lens 7 in a substantially sealed state, for example.

From the viewpoints of miniaturization, an outer shape of the housing 6 is a shape following an outer shape of the circuit board 1 (e.g., a rectangular parallelepiped shape in which a space having a substantially flat plate shape for storage is formed) and the housing 6 has a length in the Z-axis direction shorter than a length in the X-axis direction, for example. The length in the Z-axis direction of the housing 6 is, for example, set as a length that is the sum of an aperture length and a predetermined margin width, with which desirable gain is obtained when transmitting and receiving the electromagnetic waves.

On a front surface of the housing 6, an aperture 6T for transmitting and receiving the electromagnetic waves to and from the transmitting antenna 2 and the receiving antenna 3 is formed. The dielectric lens 7 is fit to the aperture 6T.

From the viewpoints of preventing the reflected waves from the cover member B from entering the housing 6, improving characteristics of dissipating heat from the circuit board 1, improving EMC characteristics, and the like, a metal member (e.g., aluminum material) is used as material of the housing 6, for example. However, when considering more about cost and weight saving, resin may be used as the material of the housing 6, or the housing 6 and the dielectric lens 7 may be integrally formed of an identical resin material. For example, the housing 6 may include material with higher thermal conductivity than the dielectric lens 7.

The dielectric lens 7 is supported in front of the circuit board 1 and narrows a beam of the electromagnetic waves from the transmitting antenna 2 to transmit the beam to a front region outside the device. The dielectric lens 7 then collects the reflected waves, which are the transmitted electromagnetic waves returning back from the target, and transmits them to the receiving antenna 3. In other words, the transmitting antenna 2 and the receiving antenna 3 are disposed at a position as a focal point of the dielectric lens 7. The dielectric lens 7 may be configured to narrow the beam of the electromagnetic waves to such a degree that the electromagnetic waves transmitted by the transmitting antenna 2 are converted to the plane waves.

The dielectric lens 7 increases gain of the transmission and reception of the electromagnetic waves by the transmitting antenna 2 and the receiving antenna 3 and also functions as a radome that protects the transmitting antenna 2 and the receiving antenna 3. The dielectric lens 7 also inhibits the reflected waves from the cover member B from entering the receiving antenna 3.

For the dielectric lens 7 according to this embodiment, a lens having a semi-cylindrical shape or a parabolic-cylindrical shape (hereinafter, referred to as semi-cylindrical shape) that projects in the positive X direction and extends along the Y-axis direction (i.e., a direction of the arrays of the antenna elements 2*a* to 2*d* and 3*a* to 3*d*) is used.

A side section of the dielectric lens 7 having the semi-cylindrical shape has substantially the same shape at any positions in the Y-axis direction (this shape is also referred to as a barrel vault shape). This makes it possible to inhibit the electromagnetic waves respectively transmitted from the multiple antenna elements 2*a* to 2*d* of the transmitting antenna 2 disposed along the Y-axis direction from being directed in different directions when being reflected at the target and arriving at the receiving antenna 3 (see FIG. 3). This inhibits deterioration of object detection accuracy caused by the mutual interference of the reflected waves or change of the phase differences.

Material of the dielectric lens 7 may be selected as desired, and, for example, acrylic resin, tetrafluoroethylene resin, polystyrene resin, polycarbonate resin, polybutylene terephthalate resin, polyphenylene resin, polypropylene resin, syndiotactic polystyrene resin, ABS resin, or the like is used as the material.

Effect

As described above, the radar device U according to this embodiment includes the antenna units 2 and 3 (typically, the phased array antennas including multiple end-fire array antennas) including multiple antenna elements 2a to 2d and 3a to 3d arrayed along a direction intersecting the front direction in the region on a side in the front direction of the circuit board 1, and the dielectric lens 7, which has the semi-cylindrical shape or the parabolic-cylindrical shape projecting in the front direction and which is supported to extend along the direction of the arrays of the multiple antenna elements 2a to 2d and 3a to 3d in the aperture 6T of the housing 6.

Thus, according to the radar device U of this embodiment, the radar device U can have a device configuration of being mounted in a lateral direction, increase the antenna gain, and improve the resolution capability of the azimuth estimation. Since the dielectric lens 7 having the semi-cylindrical shape is applied, deterioration of the radar performance due to mutual interference of the reflected waves of the electromagnetic waves transmitted from the multiple antenna elements 2a to 2d is also inhibited.

According to the radar device U of this embodiment, since the dielectric lens 7 can also function as a radome, it is possible to make the antenna units 2 and 3 waterproof and protect them from a flying object without providing a separate radome. Accordingly, it is also possible to make the antenna aperture surface smaller than that in a case of providing the separate radome.

According to the radar device U of this embodiment, it is possible to reflect the electromagnetic waves reflected at the dielectric lens 7 in a direction away from the antenna units 2 and 3 even when the electromagnetic waves transmitted from the antenna units 2 and 3 are reflected at the cover member B. This makes it possible to inhibit the deterioration of the object detection accuracy caused by the reflected waves from the cover member B.

Second Embodiment

Figure 5:
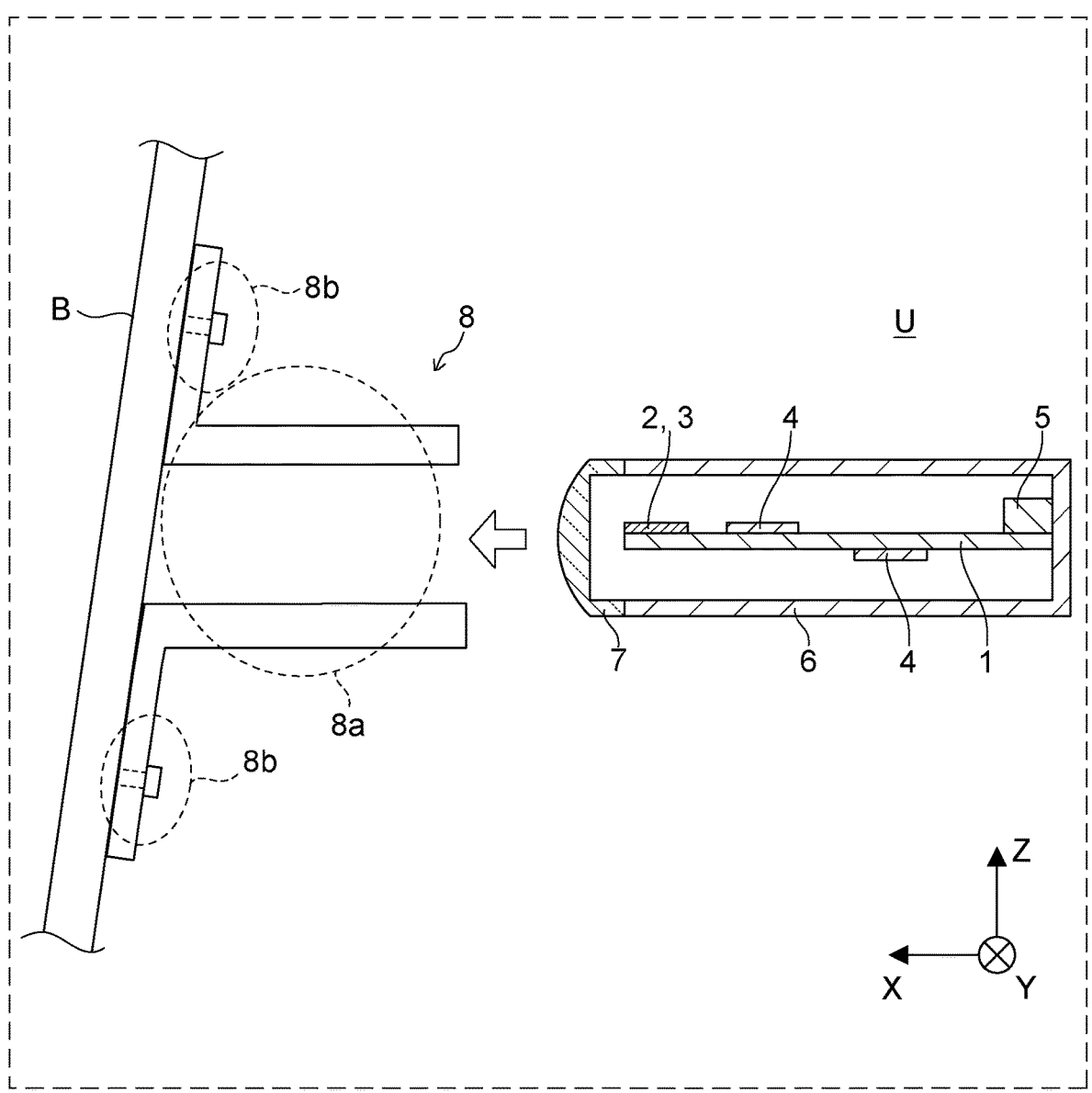
FIG. 5 is a side sectional view illustrating an example of a configuration of a radar device according to a second embodiment.

FIG. 5 is a side sectional view illustrating an example of a configuration of a radar device U according to a second embodiment.

The radar device U according to this embodiment is different from the radar device U according to the first embodiment in that the radar device U according to this embodiment has a bracket 8 for fixing the housing 6 and the like to the cover member B. Descriptions of configurations common to the first embodiment are omitted (the same applies hereinafter for other embodiments).

The bracket 8 holds the housing 6 with respect to the cover member B and defines the direction in which the radar device U transmits and receives the electromagnetic waves.

The bracket 8 has, for example, a storage part 8a that stores the radar device U and fixing parts 8b that are fixed to the cover member B.

For example, the storage part 8a is in a cylindrical shape that allows the housing 6 to be inserted therein from the front surface (i.e., surface on which the dielectric lens 7 is mounted) of the housing and forms a space for storage following the outer shape of the housing 6. The storage part 8a has an aperture in the region where the dielectric lens 7 on the front surface of the radar device U is disposed so that the radar device U transmits and receives the electromagnetic waves.

The fixing parts 8b are parts to be fixed to the cover member B with a double-sided tape, bolts, and so on. A method of fixing the fixing parts 8b to the cover member B is not limited, and ultrasonic welding or the like may also be used.

With the above configuration, the bracket 8 fixes the housing 6 to the cover member B such that the direction in which the electromagnetic waves are transmitted and received by the radar device U is parallel to the ground, for example. This enables the object detection for the target existing around the vehicle C.

The bracket 8 may include an adjustment mechanism (e.g., using pin joint and fixing pin) that can change the angle of the transmitting and receiving direction of the electromagnetic waves. Using such adjustment mechanism enables fine adjustment of the transmitting and receiving direction of the electromagnetic waves.

As described above, according to the radar device U of this embodiment, it is possible to transmit and receive the electromagnetic waves in a desirable direction (e.g., direction parallel to the ground) while mechanical stability being secured.

Third Embodiment

Figure 6:
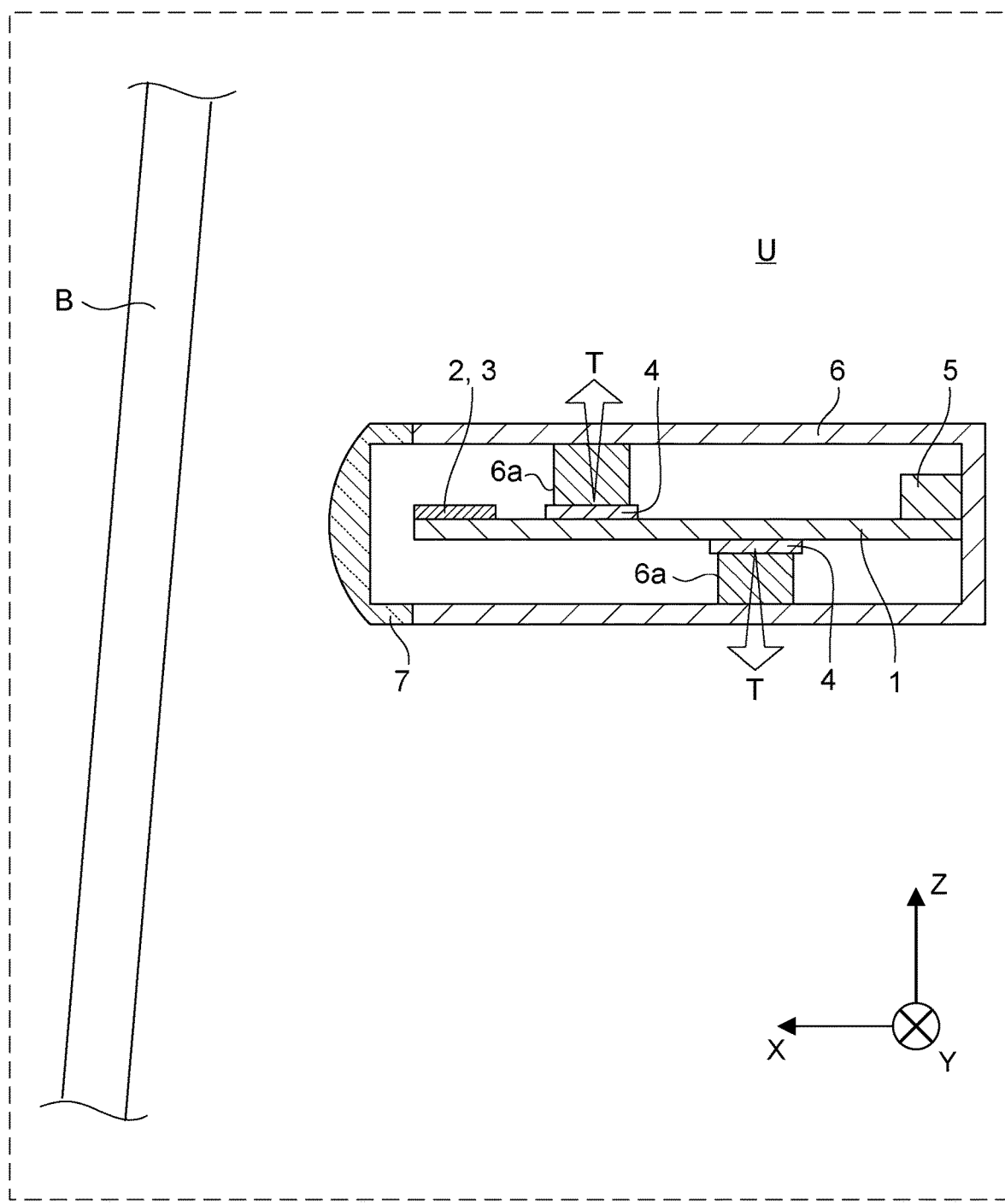
FIG. 6 is a side sectional view illustrating an example of a configuration of a radar device according to a third embodiment.

FIG. 6 is a side sectional view illustrating an example of a configuration of a radar device U according to a third embodiment.

The radar device U according to this embodiment is different from the radar device U according to the first embodiment in that the housing 6 has connection units 6a that are thermally bonded to the circuit board 1 or circuit parts mounted on the circuit board 1.

FIG. 6 illustrates a state where the connection units 6a thermally bond the walls of the housing 6 and the signal processing ICs 4. Arrows T in FIG. 6 represent heat flows from the circuit board 1.

In this embodiment, material of the housing 6 is a metal member with high heat dissipation characteristics, for example. The connection units 6a thermally bond the walls of the housing 6 and the circuit board 1 or the circuit parts (in this case, signal processing ICs 4) mounted on the circuit board 1.

The configuration of the connection units 6a is not limited; for example, the connection units 6a may be integrally formed with the walls of the housing 6 or may be made of silicone grease or an adhesive such as epoxy resin. Otherwise, the connection units 6a may be members in a form of putty, rubber, gel, or a compound.

Since the entire region of the housing 6 except the front surface is a wall region that can dissipate heat, the radar device U according to this embodiment can acquire a wide wall region of the housing 6 that can dissipate heat.

As described above, according to the radar device U of this embodiment, it is possible to improve the heat dissipation characteristics of the circuit board 1 and the like.

Fourth Embodiment

Figure 7:
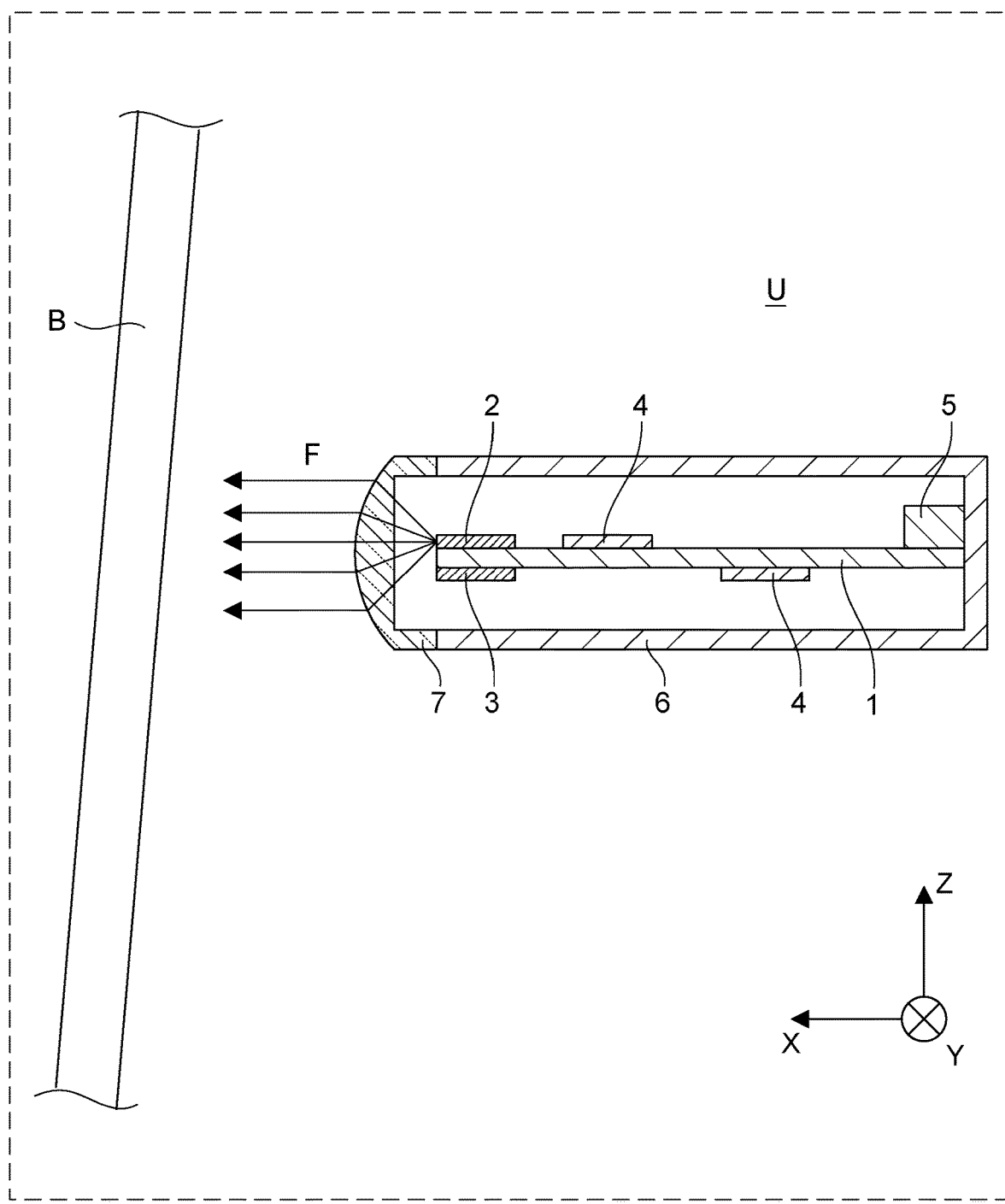
FIG. 7 is a side sectional view illustrating an example of a configuration of a radar device according to a fourth embodiment.

FIG. 7 is a side sectional view illustrating an example of a configuration of the radar device U according to a fourth embodiment.

The radar device U according to this embodiment is different from the radar device U according to the first embodiment in that the transmitting antenna 2 and/or the receiving antenna 3 are disposed on the board surface on the front surface side and the board surface on the back surface side of the circuit board 1.

FIG. 7 illustrates an aspect where the transmitting antenna 2 is disposed on the front surface side of the circuit board 1 while the receiving antenna 3 is disposed on the back surface side of the circuit board 1.

Instead of the aspect where both the transmitting antenna 2 and the receiving antenna 3 are disposed together on one of the front surface side and the back surface side of the circuit board 1, the transmitting antenna 2 and the receiving antenna 3 may be disposed dividedly on both the front surface side and the back surface side of the circuit board 1.

In the radar device U according to this embodiment, making both the board surface of the front surface side and the board surface of the back surface side of the circuit board 1 as the antenna disposing regions makes it possible to dispose more numbers of antenna elements on the surface of the circuit board 1.

As described above, according to the radar device U of this embodiment, it is possible to further increase the gain of the transmission and reception of the electromagnetic waves.

Fifth Embodiment

Figure 8:
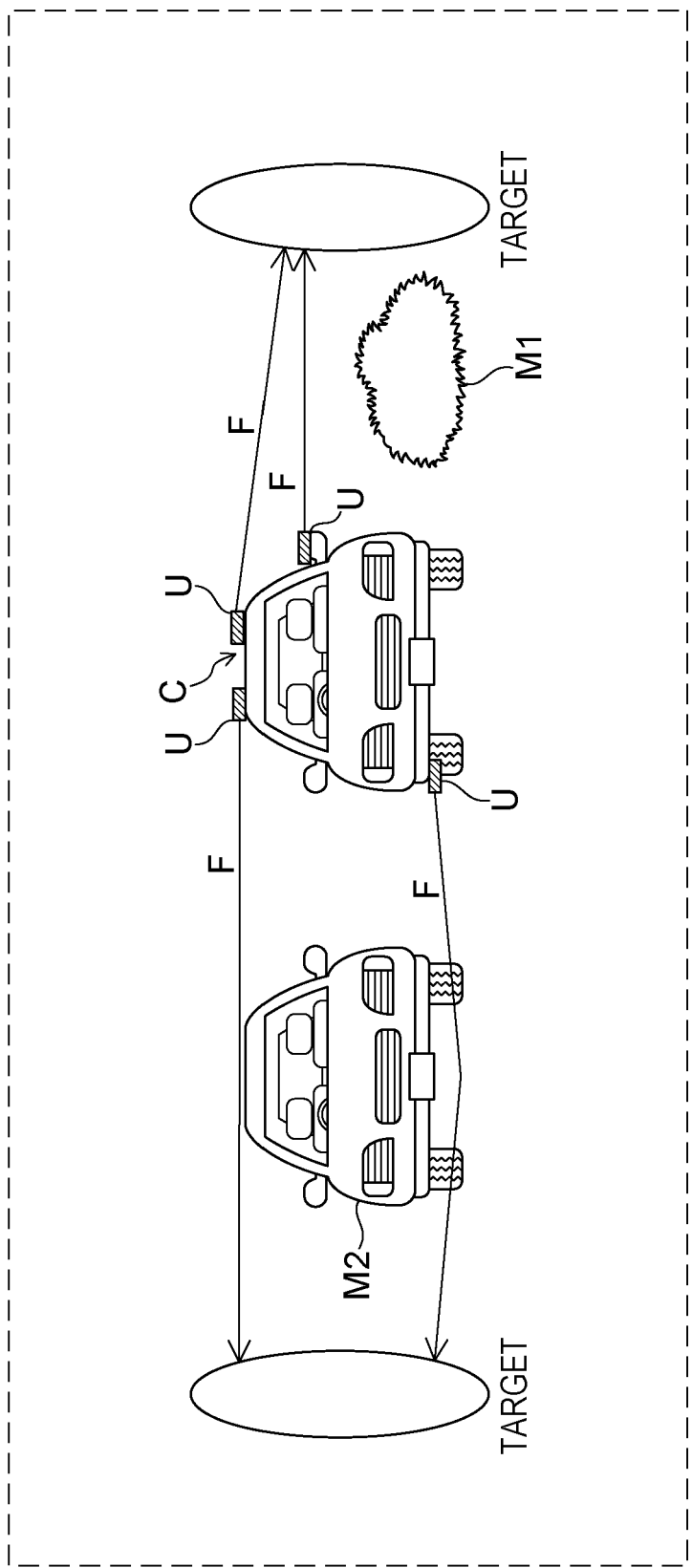
FIG. 8 is a diagram illustrating an example of a position at which a radar device according to a fifth embodiment is mounted.

FIG. 8 is a diagram illustrating an example of a position at which a radar device U according to a fifth embodiment is mounted.

The radar device U according to this embodiment is different from the radar device U according to the first embodiment in that the radar device U according to this embodiment is mounted on a vehicle body top of the vehicle C, on a vehicle body bottom of the vehicle C, or on a side mirror of the vehicle C. In FIG. 8, four radar devices U are mounted.

Radars according to the related art have been required to be mounted within a bumper so that the appearance of the vehicle is not affected, and the height at which the radars are mounted has been limited to around 30 to 60 cm. Because of this, transmission of the electromagnetic waves may be blocked by an obstacle around the vehicle and thus the area to be detected may be limited.

In this regard, since the radar device U according to this disclosure is mounted in a lateral direction, thus occupies less space in the top-bottom direction, and becomes less apparent from the outside. Thus, in this embodiment, the radar device U is mounted on the vehicle body top of the vehicle C, on the vehicle body bottom of the vehicle C, or the like.

The radar device U mounted on the vehicle body top of the vehicle C can transmit the electromagnetic waves to a distant area without being blocked by an object M1 (e.g., hedge) disposed on the road. That is, the radar device U mounted on the vehicle body top makes it possible to detect the target (e.g., person or vehicle) beyond the object M. The similar effect may be expected for the radar device U mounted on the side mirror of the vehicle C.

The radar device U mounted on the vehicle body bottom of the vehicle C can transmit the electromagnetic waves to a distant area without being blocked by another vehicle M2 by transmitting the electromagnetic waves so that the electromagnetic waves pass through a space between a vehicle body of the other vehicle M2 and the road. That is, the radar device U mounted on the vehicle body bottom makes it possible to detect the target (e.g., person or vehicle) beyond the other vehicle M2.

As described above, according to the radar device U of this embodiment, it is possible to transmit the electromagnetic waves without being blocked by another object. This makes it possible to improve the SNR and detection of a target in a distant area.

Sixth Embodiment

Figure 9:
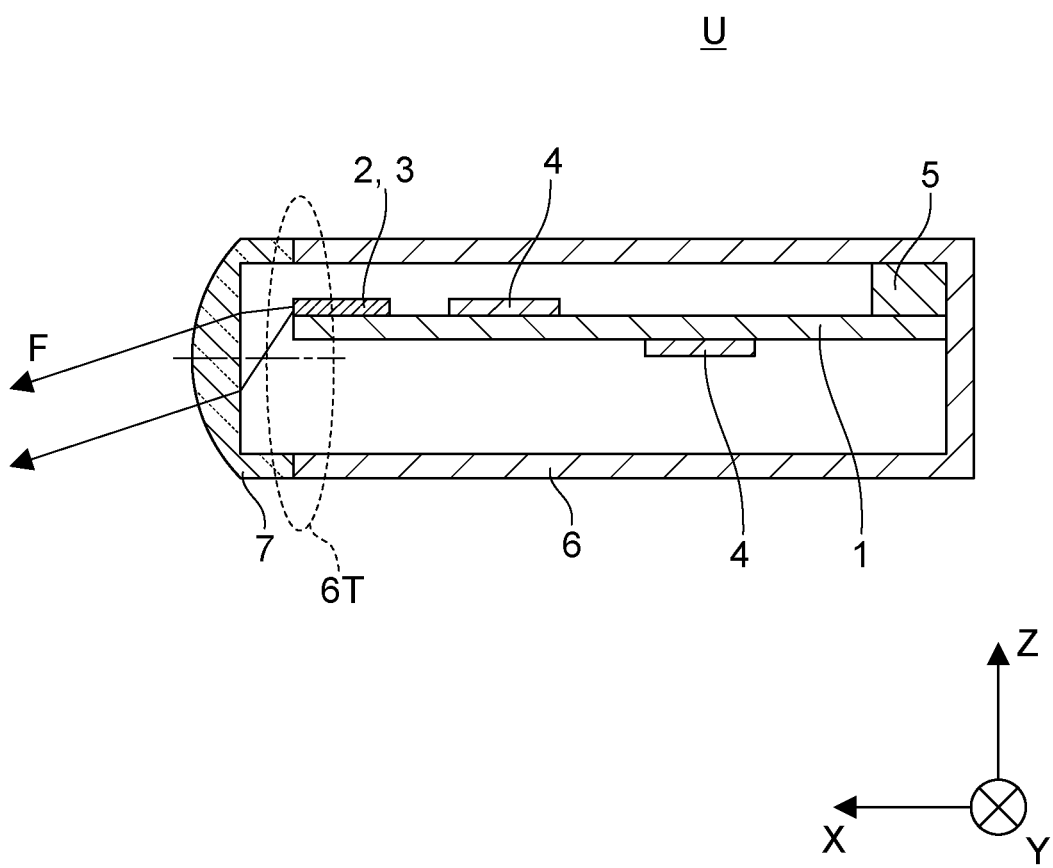
FIG. 9 is a side sectional view illustrating an example of a configuration of a radar device according to a sixth embodiment.
Figure 10:
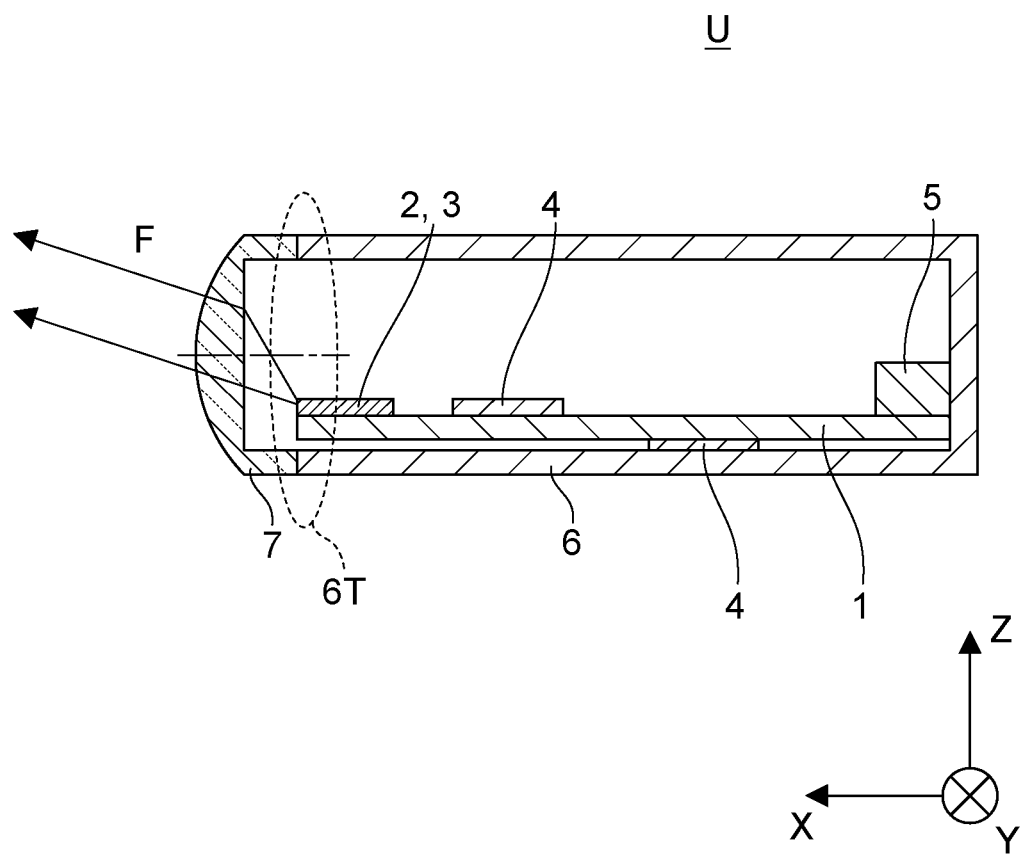
FIG. 10 is a side sectional view illustrating an example of a configuration of a radar device according to the sixth embodiment.

FIGS. 9 and 10 are side sectional views illustrating an example of a configuration of a radar device U according to a sixth embodiment.

The radar device U according to this embodiment is different from the radar device U according to the first embodiment in that the direction of the electromagnetic waves transmitted from the antenna unit (transmitting antenna 2 and receiving antenna 3) is tilted downward or upward from the X-axis direction of the extending direction of the circuit board 1 in the radar device U according to this embodiment.

FIG. 9 illustrates an aspect where the antenna unit (transmitting antenna 2 and receiving antenna 3) is disposed at a position deviated from the optical axis of the dielectric lens 7 in the upward direction in the housing 6 and the antenna unit transmits the electromagnetic waves in the direction tilted downward from the extending direction of the circuit board 1. FIG. 10 illustrates an aspect where the antenna unit (transmitting antenna 2 and receiving antenna 3) is disposed at a position deviated from the optical axis of the dielectric lens 7 in the downward direction in the housing 6 and the antenna unit transmits the electromagnetic waves in the direction tilted upward from the extending direction of the circuit board 1.

That is, with such aspects, the direction of transmitting the electromagnetic waves is tilted upward or downward from the extending direction of the housing 6.

The radar device U according to this embodiment is particularly preferable for the aspect described in the fifth embodiment (FIG. 8). That is, when the radar device U is mounted on the vehicle body top of the vehicle C, it is possible to make a top-down field of view without changing the orientation of the housing 6 by changing the direction of transmitting the electromagnetic waves downward as illustrated in FIG. 9. When the radar device U is mounted on the vehicle body bottom of the vehicle C, it is possible to inhibit reflection of the electromagnetic waves at the road by changing the direction of transmitting the electromagnetic waves upward as illustrated in FIG. 10.

The dielectric lens 7 according to this embodiment may be a dielectric lens in which the direction of the optical axis is tilted from the extending direction of the circuit board 1 or a dielectric lens in which the upper side and the lower side of the optical axis have different refractive indexes.

Other Embodiments

The present disclosure is not limited to the above-described embodiments and various modifications can be considered. For example, various combinations of the aspects described in those embodiments may be used.

In the above-described embodiments, the aspect where the board surface of the circuit board 1 extends in the front-rear direction is described as an example of the disposing aspect of the circuit board 1. However, the circuit board 1 may be disposed such that the board surface extends in a direction that is tilted in a positive Z direction or a negative Z direction from the front-rear direction.

In the above-described embodiments, a vehicle is used as an example of a target for which the radar device U is used. However, the target for which the radar device U according to the present disclosure is used is not limited thereto, and the radar device U may also be used for a rotary wing machine (e.g., helicopter), a robot, or the like.

Although specific examples of the present disclosure are described in detail, these are merely examples and do not intend to limit the scope of claims. The techniques described in the scope of claims include various modifications and changes of the specific examples described above.

The present disclosure can be realized by software, hardware, or software in cooperation with hardware.

Each functional block used in the description of each embodiment described above can be partly or entirely realized by an LSI such as an integrated circuit, and each process described in each embodiment may be controlled partly or entirely by the same LSI or a combination of LSIs. The LSI may be individually formed as chips, or one chip may be formed so as to include a part or all of the functional blocks. The LSI may include a data input and output coupled thereto. The LSI here may be referred to as an IC, a system LSI, a super LSI, or an ultra LSI depending on a difference in the degree of integration.

However, the technique of implementing an integrated circuit is not limited to the LSI and may be realized by using a dedicated circuit, a general-purpose processor, or a special-purpose processor. In addition, a FPGA (Field Programmable Gate Array) that can be programmed after the manufacture of the LSI or a reconfigurable processor in which the connections and the settings of circuit cells disposed inside the LSI can be reconfigured may be used. The present disclosure can be realized as digital processing or analogue processing.

If future integrated circuit technology replaces LSIs as a result of the advancement of semiconductor technology or other derivative technology, the functional blocks could be integrated using the future integrated circuit technology. Biotechnology can also be applied.

According to the radar device of the present disclosure, the radar device can have a horizontal device configuration and achieve high antenna gain and high azimuth resolution capability.

What is claimed is:

1. A radar device, comprising:
    a housing that includes an aperture configured to output an electromagnetic wave in a front direction;
    a circuit board that is disposed in the housing along the front direction;
    an antenna unit that includes two or more antenna elements that are arrayed in a region of the circuit board along a direction transverse to the front direction, the antenna unit configured to transmit the electromagnetic wave to outside of the housing through the aperture and to receive a reflected wave of the electromagnetic wave; and
    a dielectric lens that is integrally formed with the housing, the dielectric lens being disposed at the aperture of the housing and extending along a direction in which the two or more antenna elements are arrayed, the dielectric lens having a semi-cylindrical shape or a parabolic-cylindrical shape projecting in the front direction,
    wherein the housing and the dielectric lens are formed of the same resin material,
    wherein the antenna unit is disposed at a focal point of the dielectric lens.

2. The radar device according to claim 1, wherein each of the two or more antenna elements is composed of a conductor pattern formed on the circuit board.

3. The radar device according to claim 2, wherein each of the two or more antenna elements is an end-fire array antenna.

4. The radar device according to claim 3, wherein the antenna unit is disposed on a front surface side and a back surface side of the circuit board.

5. The radar device according to claim 1, further comprising
    a signal processing unit configured to control a phase of the electromagnetic wave transmitted from each of the two or more antenna elements and to change a transmitting direction of the electromagnetic wave transmitted to the outside of the housing.

6. The radar device according to claim 1, wherein based on a front-rear direction corresponding to a direction normal to the aperture and a top-bottom direction corresponding to a direction normal to a board surface of the circuit board,
    a length in the front-rear direction of the housing is longer than a length in the top-bottom direction of the housing.

7. The radar device according to claim 1, wherein the housing includes a connection unit that is thermally bonded to the circuit board or a circuit part mounted on the circuit board.

8. The radar device according to claim 1, wherein the electromagnetic wave is transmitted through a cover member disposed to cover a region in the front direction.

9. The radar device according to claim 1, wherein the radar device is supported such that the front direction as a transmitting direction of the electromagnetic wave is parallel to a ground.

10. A radar device, comprising:
    a housing that includes an aperture configured to output an electromagnetic wave in a front direction;
    a circuit board that is disposed in the housing along the front direction;
    an antenna unit that includes two or more antenna elements that are arrayed in a region of the circuit board along a direction transverse to the front direction, the antenna unit configured to transmit the electromagnetic wave to outside of the housing through the aperture and to receive a reflected wave of the electromagnetic wave; and
    a dielectric lens that is integrally formed with the housing, the dielectric lens being disposed at the aperture of the housing and extending along a direction in which the two or more antenna elements are arrayed, the dielectric lens having a semi-cylindrical shape or a parabolic-cylindrical shape projecting in the front direction,
    wherein the housing and the dielectric lens are formed of the same resin material,
    wherein, based on a first direction orthogonal to the circuit board and a second direction opposite to the first direction, the antenna unit is disposed at a position deviated from an optical axis of the dielectric lens in the first direction in the housing and transmits the electromagnetic wave between the second direction and the front direction.

11. A radar device, comprising:
    a housing that includes an aperture configured to output an electromagnetic wave in a front direction;

a circuit board that is disposed in the housing along the front direction;

an antenna unit that includes two or more antenna elements that are arrayed in a region of the circuit board along a direction transverse to the front direction, the antenna unit configured to transmit the electromagnetic wave to outside of the housing through the aperture and to receive a reflected wave of the electromagnetic wave; and a dielectric lens that is integrally formed with the housing, the dielectric lens being disposed at the aperture of the housing and extending along a direction in which the two or more antenna elements are arrayed, the dielectric lens having a semi-cylindrical shape or a parabolic-cylindrical shape projecting in the front direction, wherein the housing and the dielectric lens are formed of the same resin material, wherein, based on a first direction orthogonal to the circuit board and a second direction opposite to the first direction, the antenna unit is disposed at a position deviated from an optical axis of the dielectric lens in the second direction in the housing and transmits the electromagnetic wave between the first direction and the front direction.

12. The radar device according to claim 1 mounted in a vehicle.

13. The radar device according to claim 12 mounted on a vehicle body top of the vehicle.

14. The radar device according to claim 12 mounted on a vehicle body bottom of the vehicle.

15. The radar device according to claim 10, wherein the first direction is an upward direction, and the antenna unit is disposed above the optical axis of the dielectric lens.

16. The radar device according to claim 11, wherein the second direction is a downward direction, and the antenna unit is disposed below the optical axis of the dielectric lens.

* * * * *